(12) United States Patent
Kato

(10) Patent No.: US 7,782,579 B2
(45) Date of Patent: Aug. 24, 2010

(54) SEMICONDUCTOR INTEGRATED CIRCUIT

(75) Inventor: Katsuhiro Kato, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 373 days.

(21) Appl. No.: 11/838,915

(22) Filed: Aug. 15, 2007

(65) Prior Publication Data
US 2008/0062599 A1    Mar. 13, 2008

(30) Foreign Application Priority Data
Sep. 13, 2006    (JP)    ............... 2006-248097

(51) Int. Cl.
*H02H 9/00*    (2006.01)
(52) U.S. Cl. .................. 361/56; 361/91.1; 361/111
(58) Field of Classification Search .............. 361/56, 361/91.1, 111
See application file for complete search history.

(56) References Cited

U.S. PATENT DOCUMENTS 6,348,724 B1 * 2/2002 Koomen et al. ............. 257/577
6,660,603 B2 * 12/2003 Mitros ........................ 438/303
7,233,475 B1 * 6/2007 Chen .......................... 361/111
2007/0236842 A1 * 10/2007 Choi ............................ 361/56

FOREIGN PATENT DOCUMENTS

JP    6097374    4/1994

* cited by examiner

*Primary Examiner*—Stephen W Jackson
*Assistant Examiner*—Tien Mai
(74) *Attorney, Agent, or Firm*—Volentine & Whitt, P.L.L.C.

(57) ABSTRACT

A semiconductor integrated circuit has a bipolar transistor whose collector is connected to a substrate of an NMOS transistor serving as a protecting transistor. When an ESD event occurs, the bipolar transistor causes the NMOS transistor to be changed into bipolar operation at a low voltage, by supplying current to the substrate of the NMOS transistor. In accordance with this structure, good levels of ESD protecting performance and off leak current of the protecting transistor can both be achieved in the semiconductor integrated circuit.

6 Claims, 13 Drawing Sheets

L1 < L2

SEMICONDUCTOR INTEGRATED CIRCUIT

CROSS-REFERENCE TO RELATED APPLICATION

This application claims priority under 35 USC 119 from Japanese Patent Application No. 2006-248097, the disclosure of which is incorporated by reference herein.

BACKGROUND OF THE INVENTION

1. Field of the Invention

The present invention relates to a technique for improving protecting performance with respect to electrostatic discharge (ESD) in a highly-integrated semiconductor integrated circuit.

2. Description of the Related Art

Even when the semiconductor integrated circuit is staying in the time of OFF-STATE the semiconductor integrated circuit wastes a slight leakage current (hereinafter referred to as an off leak current). It is because all the elements such as MOS (Metal Oxide Semiconductor) transistors, PN junction diodes and the like which compose the semiconductor integrated circuit have immanent off leak current. Recently, the circuit scale is increasing, to realize highly performance in the semiconductor integrated circuit. Accordingly, the off leak current of the electronic component that was incorporated the semiconductor integrated circuit is increasing. Therefore the interest to the technology that decreases the off leak current of the semiconductor integrated circuit is rising.

On the other hand, in a semiconductor integrated circuit, a function circuit for executing a predetermined function requires an ESD protection circuit for protection against ESD surge intruding from the outside. An ESD protection circuit having a guard ring is disclosed in Japanese Patent Application Laid-Open (JP-A) No. 6-97374. Further, a so-called GGNMOS (Gate Grounded NMOS) is widely used as an ESD protection circuit.

In the case of using a GGNMOS as an ESD protection circuit, because the GGNMOS is connected in parallel to the function circuit, the whole off leak current of the semiconductor integrated circuit is the total sum of the off leak current wasted through the function circuit and that of the GGNMOS. Therefore, reducing the off leak current of the GGNMOS contributes to a reduction in the overall off leak current of the semiconductor integrated circuit. Here, the trade-off between the ESD protecting performance and the off leak current of a GGNMOS is a problem in conventional semiconductor integrated circuits. Namely, in a conventional ESD protection circuit using a GGNMOS, if an attempt is made to improve the ESD protecting performance (in particular, the responsiveness to ESD surge), the off leak current is increased unexpectedly This point will be explained hereinafter with reference to the drawings.

FIG. 1 is a schematic diagram of a conventional semiconductor integrated circuit 8 which includes a GGNMOS. In the semiconductor integrated circuit 8 (which will hereinafter simply be called "integrated circuit 8"), the power source potential is supplied to the VDD terminal and the ground potential is supplied to the GND terminal. A line 800 (ground line) and a line 801 (power source line) are connected to the GND terminal and the VDD terminal respectively. A function circuit 10, which is for executing a predetermined function of the integrated circuit 8, and an NMOS transistor Q22 a GGNMOS are connected in parallel between the line 800 and the line 801. In FIG. 1, CMOS inverters are shown as a simple example of the internal function circuit 10. As shown in FIG. 1, an NPN-type parasitic bipolar transistor QP22 is formed under the NMOS transistor Q22 in physical structure.

The drain of the NMOS transistor Q22 (the collector of the parasitic bipolar transistor QP22) is connected to the line 801 via a node 902. The source of the NMOS transistor Q22 (the emitter of the parasitic bipolar transistor QP22) is connected to the line 800 via a node 901. The substrate of the NMOS transistor Q22 (the base of the parasitic bipolar transistor QP22) is connected to the line 800 via a substrate resistor Rs and a node 903.

A case in which an ESD event occurs at the VDD terminal of this integrated circuit 8 will be described. When a positive ESD surge is applied to the line 801 due to this ESD event, the function circuit 10 is protected due to the MOS transistor Q22 causing a breakdown. Namely, due to the rise in the substrate potential caused by the breakdown of the NMOS transistor Q22, the parasitic bipolar transistor QP22 turns on, and as shown in FIG. 1, surge current is emitted to the ground through a current path which is directed from the node 902 toward the node 901.

It is important that the breakdown of NMOS transistor Q22 occurs earlier than that of the NMOS transistors (Q101 and the like) in this ESD protection event.

However, by using the NMOS transistor Q22 composed with GGNMOS, the conventional semiconductor integrated circuit which accomplishes a large integration scale, it is difficult to keep finely the both characteristic that are a low off leak current and better ESD protection. This point will be described hereinafter.

First, the relationship between the gate length and the ESD protecting performance is shown with reference to FIG. 2. FIG. 2 is an imaginable graph showing that indicates the relationships (V-I characteristics) between the voltage of the line 801 and the current flowing to the GND terminal from the drain of the NMOS transistor Q22 when an ESD event occurs at the VDD terminal of the integrated circuit 8. As shown in FIG. 2, (a) shows a case in which the gate length of the NMOS transistor Q22 is a minimum and the gate width is sufficiently large, and (b) shows a case in which the gate length of the NMOS transistor Q22 is a minimum and the gate width is small, and (c) shows a case in which the gate length of the NMOS transistor Q22 is sufficiently large. Note that, (d) in FIG. 2 shows the V-I characteristic of the function circuit 10 for reference.

The V-I characteristics shown in FIG. 2 are generally known as snapback characteristics. In FIG. 2, in the case of (a), the NMOS transistor Q22 could taken on the surge current of 1.33 A (a current value corresponding to 2 kV HBM (Human Body Model) which is an official standard) before the function circuit 10 reaching the critical voltage (breakdown voltage). In the case of (b), it suggests that the possibility, that the function circuit reaches to breakdown voltage previously even from that the NMOS transistor Q22 pour surge current sufficiently. In the case of (c), any transistor that composes the function circuit causes the breakdown previously even from the breakdown of the NMOS transistor Q22. Therefore, there is the possibility that the function circuit 10 will receive ESD damage. As also, in the case of (c), function circuit 10 is not protected, even if the gate width is enlarged.

From the above, it can be understood that, in order to improve the ESD protecting performance of the NMOS transistor Q22 using a GGNMOS, mainly, it is necessary to make the gate length as short as possible.

On the other hand, as for the MOS transistor, it is known that a negative correlation between the off leak current and the gate length generally.

Therefore, in FIG. 2, in the case of (a), the off leak current is extremely large. In the case of (b), because the gate width is smaller than in the case of (a), the off leak current is smaller than in the case of (a). In the case of (c), because the gate length is sufficiently large, the off leak current is small.

Accordingly, as can be understood by referring to FIG. 2, in a GGNMOS (the NMOS transistor Q22), there is a trade-off between the ESD protecting performance and the off leak current. Namely, in a GGNMOS (the NMOS transistor Q22), if the gate length is made to be large, it brings both the ESD protecting performance deteriorates and the off leak current decreases. If the gate length is made to be small, it makes improvement of the ESD protecting performance and increasing of the off leak current.

The ill effects due to the trade-off between the ESD protecting performance and the off leak current of a GGNMOS become even more marked as the integration scale of the function circuit is increased. This point will be described by referring to FIG. 1 again.

In FIG. 1, in order to increase the integration scale of the function circuit 10, the gate length of the NMOS transistors within the function circuit 10 is usually designed to be the minimum value which is allowed in the fabrication process. On the other hand, in order for the NMOS transistor Q22 to attempt to cause a breakdown before the NMOS transistors within the function circuit 10 from the standpoint of ESD protection, the gate length of the NMOS transistor Q22 must be made to be shorter than the NMOS transistors within the function circuit 10. The gate length of the NMOS transistors within the function circuit 10 is the minimum value which is allowed in the fabrication process naturally, a transistor of a gate length which is shorter than that cannot be fabricated. Therefore, the gate length of the NMOS transistor Q22 is also designed to be the minimum value which is allowed in the fabricating process.

In this conventional integrated circuit 8 shown in FIG. 1, PMOS transistors (Q101, Q103, and the like) which are connected in series to the NMOS transistors become load resistances and work to delay the NMOS(Q102, Q104, and the like) breakdown timing.

In this way, even if the gate lengths of the MOS transistors in the function circuit 10 and the NMOS transistor Q22 are equal values (the minimum value allowed in the fabricating process), due to the NMOS transistor Q22 causing a breakdown earlier than the MOS transistors in the function circuit 10 and moving on to bipolar operation (the parasitic bipolar transistor QP22 turning on), the function circuit 10 is protected from an ESD event. However, the ESD protecting performance in this case relies on the existence of a PMOS transistor within the function circuit 10, and it is difficult to ensure a good ESD protecting performance by only a GGNMOS independently from the function circuit 10.

As described above, in the integrated circuit 8 which aims for a large integration scale, it is difficult to ensure a good ESD protecting performance, and in addition, when the gate length of the NMOS transistor Q22 using a GGNMOS is small, the off leak current of the NMOS transistor Q22 becomes very large. Namely, in a conventional semiconductor integrated circuit, it is difficult to keep finely the both characteristic that are a low off leak current and better ESD protection for the NMOS transistor Q22 in FIG. 1, and it has been desired to overcome this problem.

SUMMARY OF THE INVENTION

A semiconductor integrated circuit of the present invention has a reference potential line to which a reference potential is provided, a first potential line to which a first power source potential is provided, a second potential line to which a second power source potential is provided, a protecting transistor of a first conductive type, a function circuit executing a predetermined function by a transistor, and a bipolar transistor of a second conductive type. The function circuit and the protecting transistor are connected in parallel between the reference potential line and the first potential line. The base of the bipolar transistor is connected to the second potential line, the emitter of the bipolar transistor is connected to the first potential line, and the collector of the bipolar transistor is connected to a substrate of the protecting transistor. The second power source potential is set such that the bipolar transistor can not turn on at times of normal operation.

Note that normal operation is operation at the time when a predetermined power source potential is applied to the semiconductor integrated circuit and the function circuit is executing a predetermined function.

In accordance with the semiconductor integrated circuit of the present invention, when an ESD event occurs at the first potential line, the bipolar transistor turns on, and supplies current to the substrate of the protecting transistor. The bipolar transistor thereby changes the protecting transistor into bipolar operation at a low voltage. In this way, before the applied voltage in the ESD event reaches the breakdown voltage of the transistor within the function circuit, surge current is dissipated to the reference potential line as collector current of a parasitic bipolar transistor which is formed under the protecting transistor.

This ESD protecting operation does not depend on the gate length of the protecting transistor. Accordingly, off leak current can be reduced by setting the gate length of the protecting transistor to be large.

In accordance with the semiconductor integrated circuit of the present invention, better ESD protecting performance and low off leak current for the protecting transistor can both be obtained.

BRIEF DESCRIPTION OF THE DRAWINGS

Preferred exemplary embodiments of the present invention will be described in detail based on the following figures wherein.

DETAILED DESCRIPTION OF THE INVENTION

First Exemplary Embodiment

A first exemplary embodiment of a semiconductor integrated circuit (hereinafter abbreviated to "integrated circuit" for convenience) of the present invention will be described hereinafter.

The integrated circuit of the present exemplary embodiment is provided with a reliable ESD protecting performance in accordance with a relatively simple structure, even in cases in which the integration scale of a function circuit for executing a predetermined function (generally called "internal circuit" upon occasion) is high. Hereinafter, the structure and operation of an integrated circuit 1 of the present exemplary embodiment will be described in that order with reference to FIG. 3 through FIG. 5.

[Structure of Integrated Circuit 1]

Figure 3:
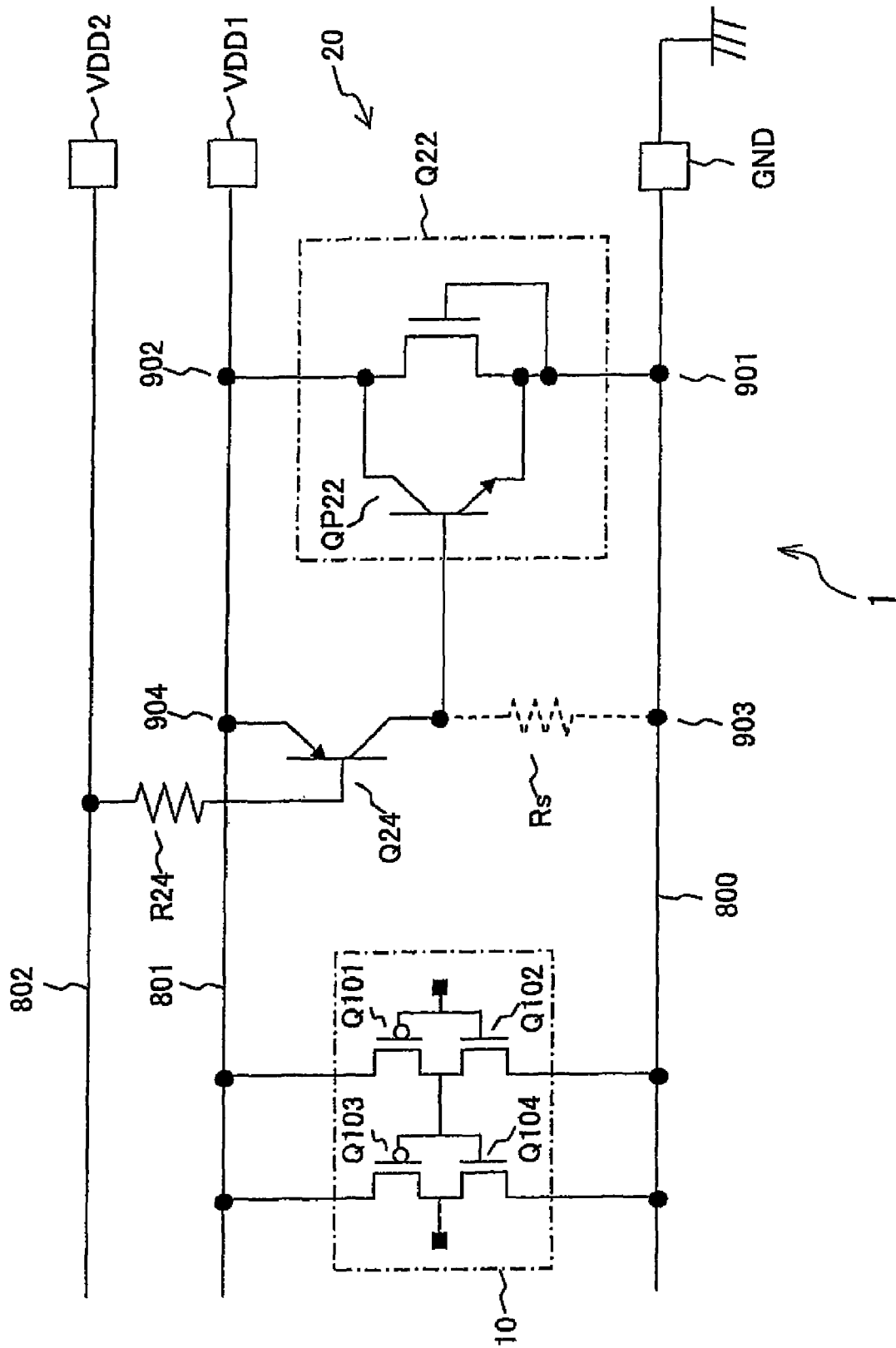
FIG. 3 is a schematic circuit diagram of a first exemplary embodiment.

FIG. 3 is a schematic circuit diagram of the integrated circuit 1 which includes an ESD protection circuit.

The integrated circuit 1 includes the function circuit 10 for executing a predetermined function, and an ESD protection circuit 20 for protecting the function circuit 10 from an ESD event. The ESD protection circuit 20 has the NMOS transistor Q22 (protecting transistor) as a GGNMOS, a bipolar transistor Q24, and a resistor R24. Note that, in the present exemplary embodiment, the gate lengths of the MOS transistors within the function circuit 10 are the minimum value allowed in the fabricating process, in order to aim for high integration of the function circuit 10.

In the integrated circuit 1, a VDD 1 terminal to which power source potential VDD1 (first power source potential) is provided, a VDD2 terminal to which power source potential VDD2 (second power source potential) is provided, and a GND terminal to which ground potential (reference potential) is provided are provided as the electric power supplying terminals. The line 800 (reference potential line), the line 801 (first potential line), and the line 802 (second potential line) are connected to the GND terminal, the VDD1 terminal, and the VDD2 terminal, respectively. The function circuit 10 and the NMOS transistor Q22 are connected in parallel between the line 800 and the line 801. In FIG. 3, as a simple example, CMOS inverters (a PMOS transistor Q101 and an NMOS transistor Q102, and a PMOS transistor Q103 and an NMOS transistor Q104) are provided at the inside of the function circuit 10.

In terms of structure, the NPN-type parasitic bipolar transistor QP22 is formed under the NMOS transistor Q22 as shown in FIG. 3. The drain of the NMOS transistor Q22 (the collector of the parasitic bipolar transistor QP22) is connected to the line 801 via the node 902. The source of the NMOS transistor Q22 (the emitter of the parasitic bipolar transistor QP22) is connected to the line 800 via the node 901. The substrate of the NMOS transistor Q22 (the base of the parasitic bipolar transistor QP22) is connected to the line 800 via the substrate resistor Rs and the node 903.

In the ESD protection circuit 20, the PNP-type bipolar transistor Q24 behaves as a trigger element for making the NMOS transistor Q22 using a GGNMOS is changed into bipolar operation at an early stage after an ESD event occurs.

In the integrated circuit 1, the base of the bipolar transistor Q24 is connected to the line 802 (the power source potential VDD2) via the resistor R24. The emitter of the bipolar transistor Q24 is connected to the line 801 (the power source potential VDD1) via a node 904. The collector of the bipolar transistor Q24 is connected to the substrate of the NMOS transistor Q22 (the base of the parasitic bipolar transistor QP22).

Note that, in the integrated circuit 1, the power source potential VDD2 is set so as to satisfy following formula (1), where Vf is the forward direction voltage of the PN junction (about 0.6 V in the case of a silicon semiconductor).

$$VDD2+Vf>VDD1 \quad (1)$$

By satisfying above formula (1), at times of normal operation when an ESD event does not occur, reverse bias is applied to the bipolar transistor Q24, and the bipolar transistor Q24 is fixed to off state. Accordingly, the bipolar transistor Q24 does not cause adverse effects in the normal operation of the function circuit 10 (e.g., a drop in the potential of the line 801 accompanying the bipolar transistor Q24 turning on).

[Operation of Integrated Circuit 1]

The ESD protecting operation of the integrated circuit of the present exemplary embodiment will be described next with reference to FIG. 4 and FIG. 5.

Figure 4:
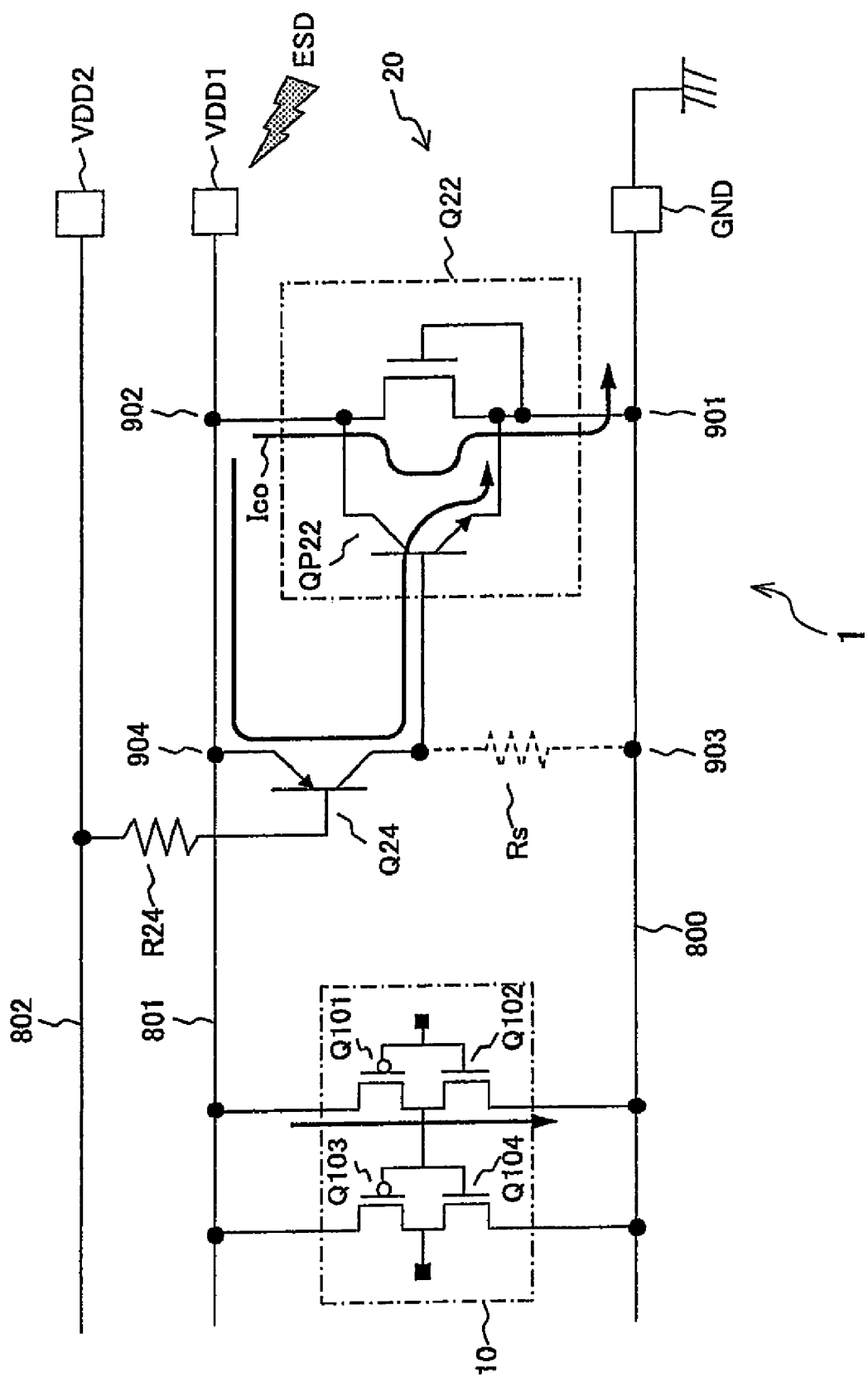
FIG. 4 is a drawing showing the flow of surge current at the time an ESD event occurs in the integrated circuit of the first exemplary embodiment.

FIG. 4 is a drawing showing the flow of surge current in a case in which an ESD event occurs at the VDD1 terminal. FIG. 5 is an imaginable graph showing that indicates the relationship (the V-I characteristic) between the voltage of the line 801 and the current flowing from the drain of the NMOS transistor Q22 to the GND terminal when an ESD event occurs at the VDD1 terminal. As shown in FIG. 5, (a) shows a case in which the gate length of the NMOS transistor Q22 is a minimum value, i.e., the gate length is the minimum value allowed in the fabricating process in the same way as the MOS transistors in the function circuit 10, and (b) shows a case in which the gate length of the NMOS transistor Q22 is longer than the minimum value. Note that (c) in FIG. 5 shows the V-I characteristic of the function circuit 10 for reference.

First, the ESD protecting operation in a case in which the gate length of the NMOS transistor Q22 is the minimum value in the same way as the MOS transistors within the function circuit 10 (the case of (a) in FIG. 5) will be described.

In FIG. 4, when positive ESD surge voltage is applied to the line 801 by an ESD event, the ESD surge voltage provides forward bias with respect to the PNP-type bipolar transistor Q24. Accordingly, the bipolar transistor Q24 turns on, and base current and collector current are generated. At this time, because the base of the bipolar transistor Q24 is not electrically connected to either of the line 800 which is grounded or to the line 801 at which the ESD surge is providing, both the base current and the collector current are supplied to the substrate of the NMOS transistor Q22. The currents supplied from the bipolar transistor Q24 become the base current of the parasitic bipolar transistor QP22.

Figure 5:
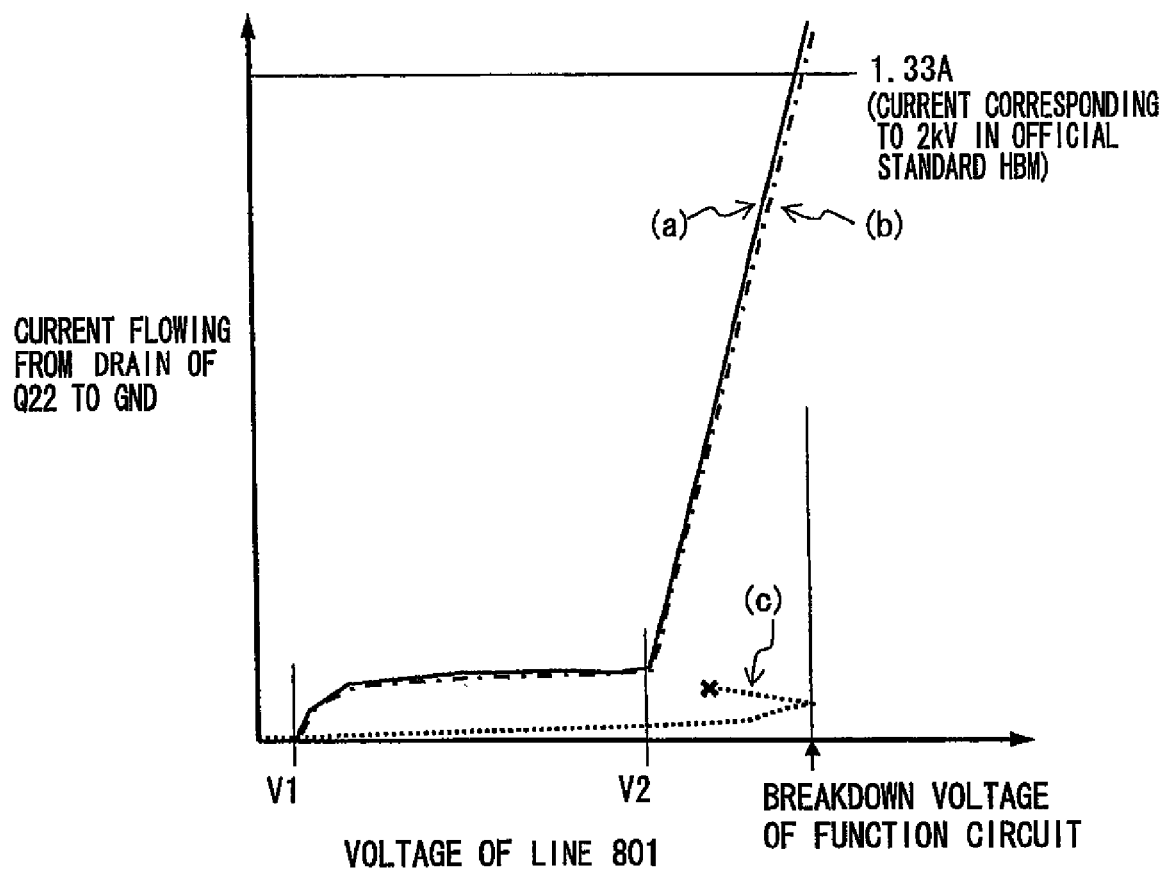
FIG. 5 is an imaginable graph showing V-I characteristics at the time an ESD event occurs in the integrated circuit of the first exemplary embodiment.

Referring to FIG. 5, at the point in time when the voltage of the line 801 reaches V1 (=2×Vf (where Vf is forward direction voltage)) due to the positive ESD surge, forward bias is applied to the parasitic bipolar transistor QP22, and the parasitic bipolar transistor QP22 turns on. Note that V1 is about 1.2 V in the case of a silicon semiconductor.

If the voltage of the line 801 exceeds V1, the parasitic bipolar transistor QP22 turns on and starts bipolar operation. However, as shown in FIG. 5, until the voltage of the line 801 reaches V2, the current flowing from the emitter of the parasitic bipolar transistor QP22 to the line 800 is extremely small. When the voltage of the line 801 is in the range from V1 to V2, the current which is emitted from the drain of the NMOS transistor Q22 to the ground is mainly the current supplied from the bipolar transistor Q24, i.e., the current which flows from the base to the emitter of the parasitic bipolar transistor QP22.

Figure 1:
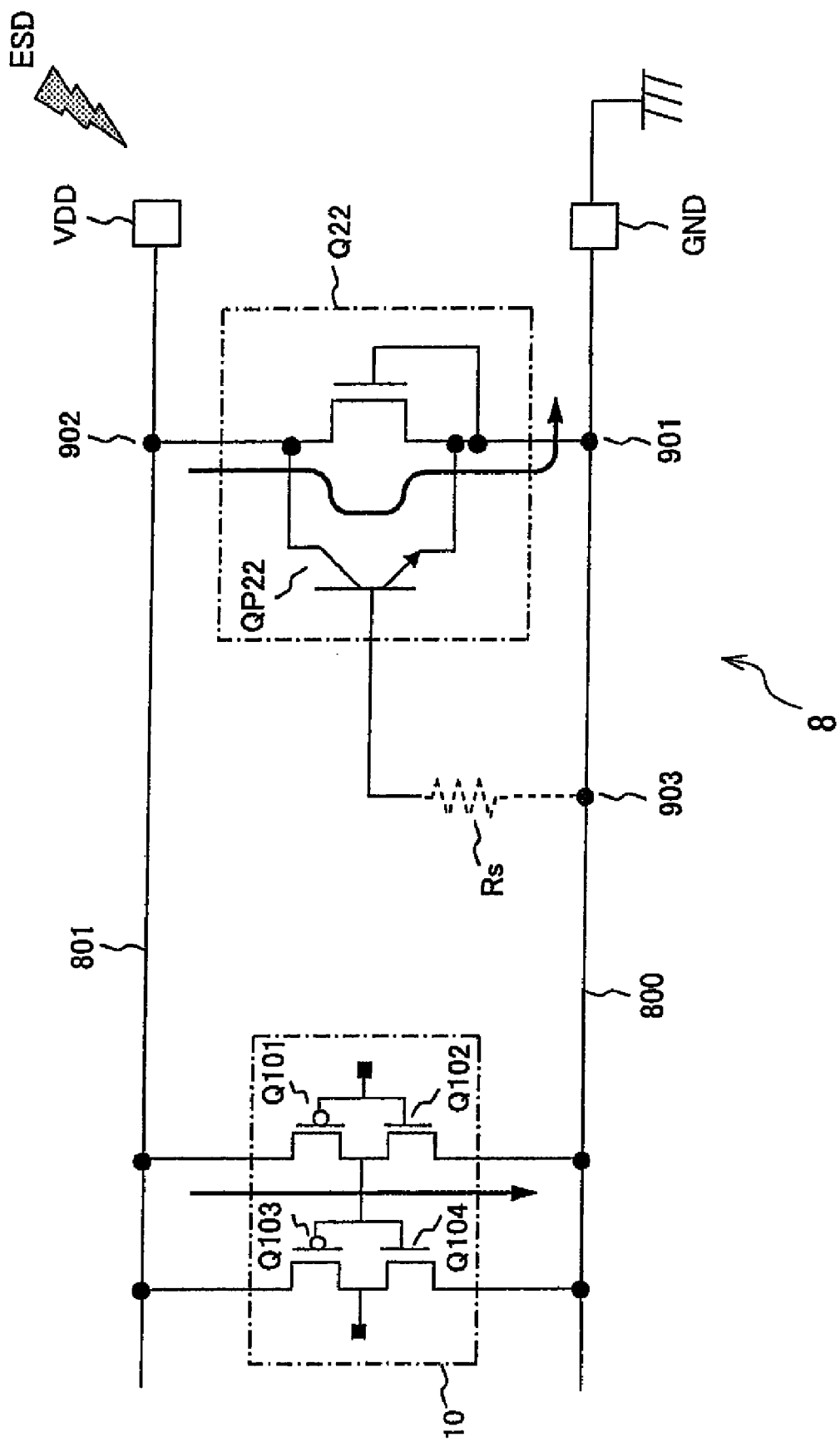
FIG. 1 is a schematic circuit diagram of a conventional integrated circuit.
Figure 2:
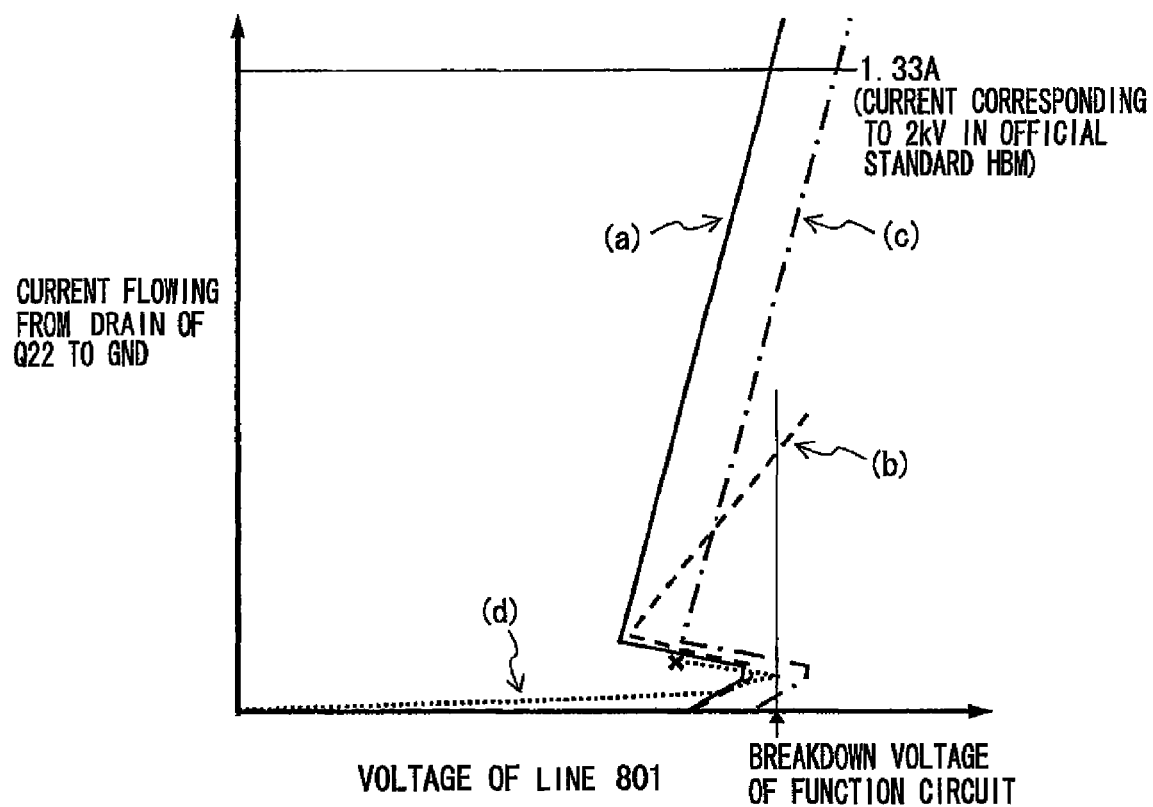
FIG. 2 is an imaginable graph showing V-I characteristics (snapback characteristics) at the time an ESD event occurs in the conventional integrated circuit.

When the voltage of the line 801 exceeds V2, the parasitic bipolar transistor QP22 starts full-functional bipolar operation, and collector current Ico (see FIG. 4), which is β times of the base current supplied from the bipolar transistor Q24 (where β is the current gain), flows toward the emitter. When the voltage of the line 801 exceeds V2, this collector current Ico becomes dominant as surge current. Note that the V-I characteristic at the time when the voltage of the line 801 exceeds V2 is the same as (a) of FIG. 2.

As shown in FIG. 5, by the bipolar transistor Q24, the ESD protection circuit 20 in the present exemplary embodiment can cause the NMOS transistor Q22 to be changed into bipolar operation at a low voltage, without applying a high voltage which causes the NMOS transistor Q22 to be changed to a negative resistance region. For example, the breakdown voltage of the function circuit 10 is approximately higher than or equal to 3 V, but the NMOS transistor Q22 starts bipolar operation at about 1.2 V (in the case of a silicon semiconductor). Namely, the surge current can be emitted to the ground before the voltage of the line 801 reaches a high voltage at which there is the possibility that the NMOS transistors within the function circuit 10 will cause a breakdown. Accordingly, an ESD protecting performance with good responsiveness to an ESD event is obtained.

Next, the ESD protecting operation in a case in which the gate length of the NMOS transistor Q22 is longer than that of the MOS transistors within the function circuit 10 (the case of (b) in FIG. 5) will be described.

Figure 6B:
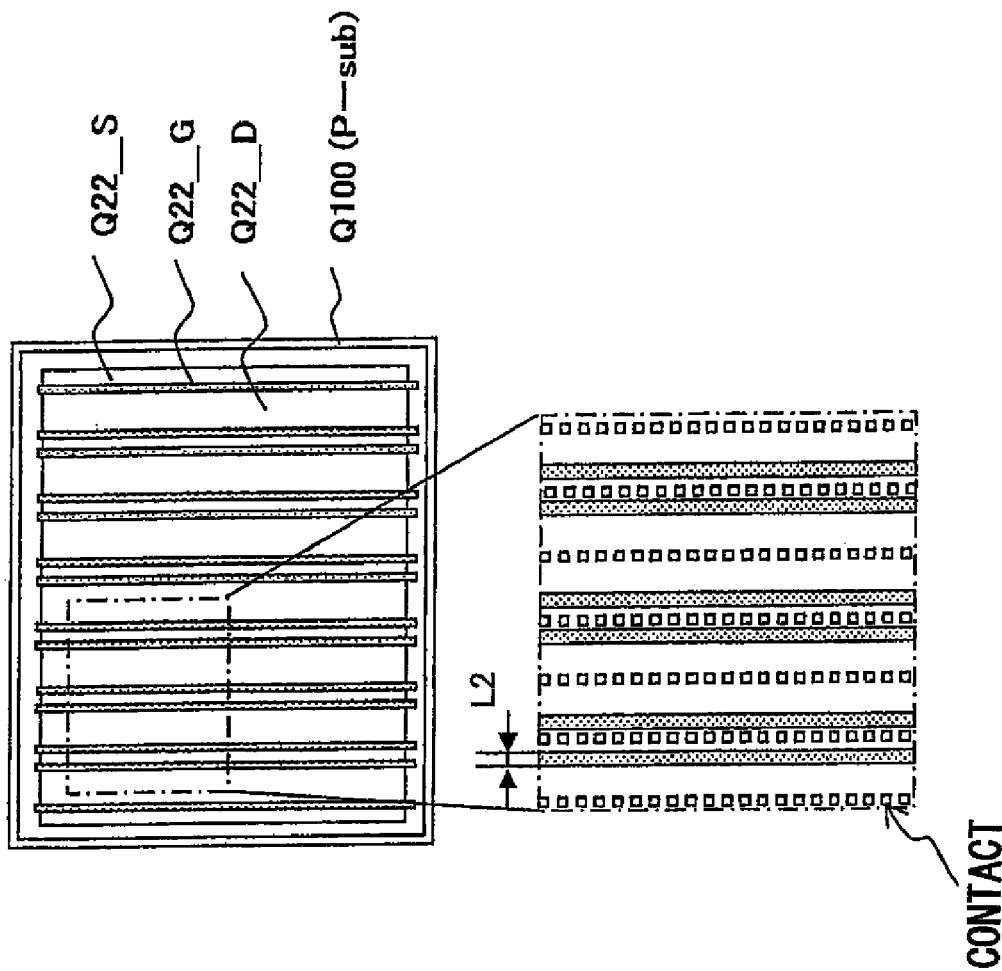
FIG. 6B is a partial plan view of the integrated circuit of the first exemplary embodiment, and shows the relationship between the gate length of the transistors within the function circuit and the gate length of the protecting transistor.
Figure 6A:
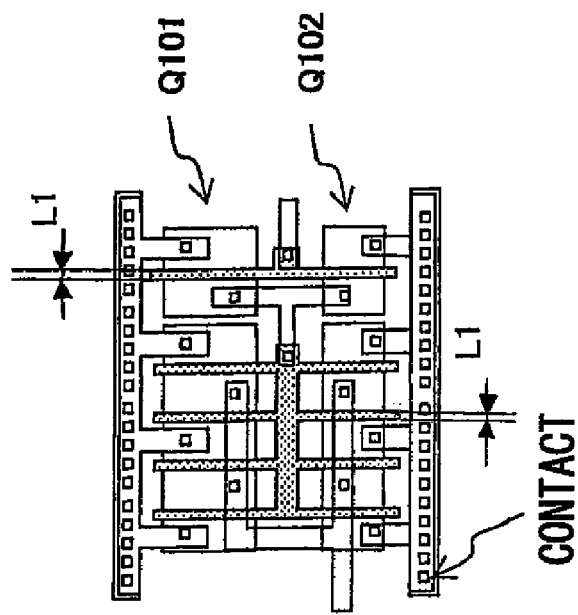
FIG. 6A is a partial plan view of the integrated circuit of the first exemplary embodiment, and shows the relationship between the gate length of transistors within a function circuit and the gate length of a protecting transistor.

FIGS. 6A and 6B are partial plan views of the integrated circuit 1, and illustrate the size relation both of the gate length of the MOS transistors within the function circuit 10 and the gate length of the NMOS transistor Q22. FIG. 6A is a plan view of the function circuit 10, and FIG. 6B is a plan view of the NMOS transistor Q22. As shown in FIG. 6A and FIG. 6B, the transistors within the integrated circuit 1 are patterned such that a source region (N-type impurity diffusion region), a gate region (poly silicon region), and a drain region (N-type impurity diffusion region) repeat in that order on a P-type substrate. For example, the NMOS transistor Q22 is patterned such that a source region Q22_S, a gate region Q22_C and a drain region Q22_D repeat in that order on a P-type substrate 100 (p-sub).

In FIGS. 6A and 6B, given that the gate length of the MOS transistors within the function circuit 10 is L1 (the minimum value allowed in the fabrication process) and the gate length of the NMOS transistor Q22 is L2, the V-I characteristic is as shown by (b) of FIG. 5 in a case in which L2>L1 is satisfied. Namely, if the gate length L2 of the NMOS transistor Q22 is made to be longer than the gate length L1 of the MOS transistors within the function circuit 10, the collector current Ico of the parasitic bipolar transistor QP22 decreases. Because the base width of NMOS transistor that has the gate length L2 is wider than that of NMOS transistor that has gate length L1, the current gain β decreases as extending the gate length, and the collector current Ico becomes difficult to flow.

Accordingly, as illustrated in FIG. 5, the whole of V-I characteristic shown by (b) is shifted slightly downward from the V-I characteristic shown by (a).

As shown in FIG. 5, in the integrated circuit 1 of the present exemplary embodiment, even if the gate length of the NMOS transistor Q22 is made to be longer than the gate length of the MOS transistors within the function circuit 10, no great difference can be seen in the current driving ability at the time when the surge current is dissipated to the ground. This is because, at the ESD protection circuit 20 of the integrated circuit 1, the parasitic bipolar transistor QP22 of the NMOS transistor Q22 is driven directly by the substrate current (base current) supplied from the bipolar transistor Q24. Accordingly, in the integrated circuit 1 of the present exemplary embodiment, even if the gate length of the NMOS transistor Q22 which is a GGNMOS is selected independently of the gate length of the MOS transistors within the function circuit 10, as for the effect on the ESD protecting performance is small. In other words, in the integrated circuit 1 of the present exemplary embodiment, the gate length of the NMOS transistor Q22 which is the protecting transistor can be selected without taking into consideration the effects on the ESD protecting performance.

From this standpoint, in the integrated circuit 1 of the present exemplary embodiment, it is preferable that gate length of the NMOS transistor Q22 be made to be longer than the gate length of the MOS transistors in the function circuit 10. In this way, the off leak current at the NMOS transistor Q22 is less than in a case in which the gate length is the minimum value (the gate length of the MOS transistors in the function circuit 10). Because the NMOS transistor Q22 is connected in parallel to the function circuit 10, decreasing the off leak current of the NMOS transistor Q22 contributes to a reduction in the off leak current of the integrated circuit 1 on the whole.

The above description is summarized in following points (A) through (C). Namely:

(A)

In accordance with the integrated circuit 1 of the present exemplary embodiment, the bipolar transistor Q24, whose collector is connected to the substrate of the NMOS transistor Q22 which serves as a protecting transistor (a GGNMOS), is provided. Due to this bipolar transistor Q24 supplying current to the substrate of the NMOS transistor Q22 at the time when an ESD event occurs, the bipolar transistor Q24 changes the NMOS transistor Q22 into bipolar operation at lower voltage.

Accordingly, the surge current can be dissipated to the ground as collector current before the applied voltage in an ESD event reaches the breakdown voltage of the NMOS transistors within the function circuit 10, and an ESD protecting performance with good responsiveness is obtained.

(B)

It is preferable that the gate length of the NMOS transistor Q22 which serves as the protecting transistor be selected to a value which is longer than the gate length of the MOS transistors within the function circuit 10. In this way, both high integration of the function circuit 10 and a reduction in the off leak current of the integrated circuit 1 overall can be achieved, while the ESD protecting performance is maintained.

(C)

In the integrated circuit 1, the bipolar transistor Q24 is fixed to off state in order for the bipolar transistor Q24 to not affect the function circuit 10 at the time of normal operation. To this end, a bias which satisfies above formula (1) is set for the bipolar transistor Q24.

Note that the power source voltage VDD2 which satisfies above formula (1) is needed within the integrated circuit 1. However, in a case in which two or more power source voltages are provided in advance within the integrated circuit 1, there is no need to newly provide this power source voltage VDD2 at the integrated circuit 1. For example, at the integrated circuit 1, in a case in which an input/output section which carries out interfacing with external devices operates at a power source voltage of 3.3 V and the function circuit 10 operates at a power source voltage of 1.2 V, above formula (1) is satisfied if VDD2 is selected for 3.3 V and VDD1 is selected for 1.2 V in the present exemplary embodiment.

Figure 7:
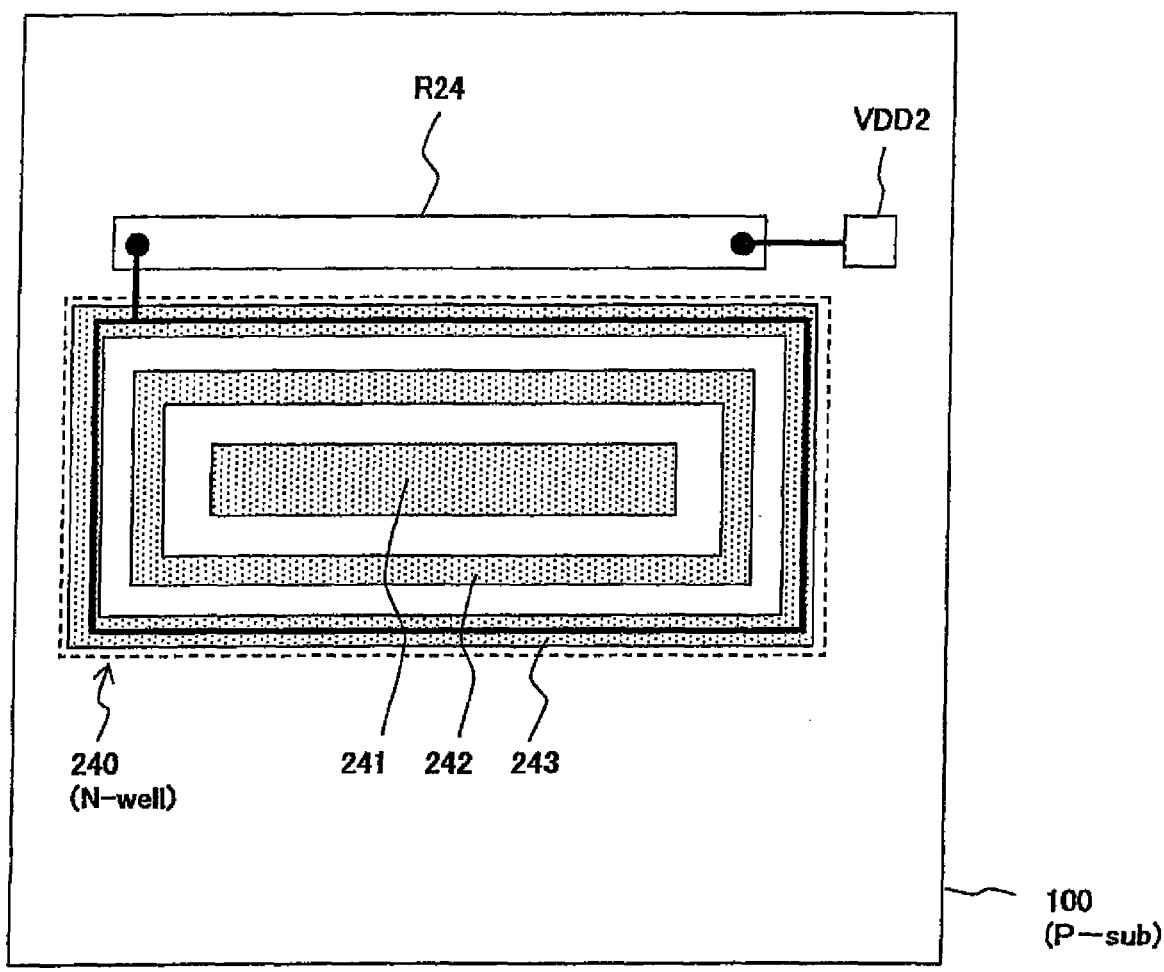
FIG. 7 is a plan view of the integrated circuit of the first exemplary embodiment, and shows a preferred arrangement of a bipolar transistor within an ESD protection circuit.

Next, a preferred arrangement of the PNP-type bipolar transistor Q24 will be described with reference to FIG. 7. FIG. 7 is a plan view of the integrated circuit 1, and shows a preferred arrangement of the bipolar transistor Q24. Note that the function circuit 10 and the NMOS transistor Q22 are omitted from FIG. 7.

As shown in FIG. 7, the bipolar transistor Q24 is formed at the N-type well region (N-well) 240 within the P-type substrate 100. A first region 241 is formed at the central portion of the N-type well region 240. A ring-shaped second region 242 is formed at the periphery of the first region 241. A ring-shaped third region 243 is formed at the periphery of the second region 242.

It is preferable that, in the plan view of FIG. 7, the base region of the bipolar transistor Q24 (an N-type impurity diffusion region) is disposed at either of the first region 241 or the third region 243. In other words, it is preferable that either the emitter region (a P-type impurity diffusion region) or the collector region (a P-type impurity diffusion region) be disposed at the second region 242. In this way, the base width of the bipolar transistor Q24 can be made to be narrow, and the current gain β can be made to be large. Accordingly, much current can be supplied to the base of the parasitic bipolar transistor QP22, and as a result, much surge current can be dissipated to the ground. Namely, by disposing the base region of the bipolar transistor Q24 at either of the first region 241 or the third region 243, the current driving ability of the parasitic bipolar resistor QP22 improves, and, further, a good ESD protecting performance is obtained.

Note that it is more preferable that the base region be formed at the third region 243 which is at the outermost side. This is because, by forming the base region at the outermost side as shown in FIG. 7, designing of inter connect layers at the integrated circuit 1 (in particular, designing of the line 802 which is a power source line) is facilitated.

The first exemplary embodiment of the present invention has been described above in detail, but concrete structures are not limited to those of the present exemplary embodiment, and changes in design within a scope which does not depart from the gist of the present invention are included.

For example, the present invention can be applied to a substrate of a conductive type which is different than in the above-described exemplary embodiment. The structure of the ESD protection circuit in this case will be described with reference to FIG. 8.

Figure 8:
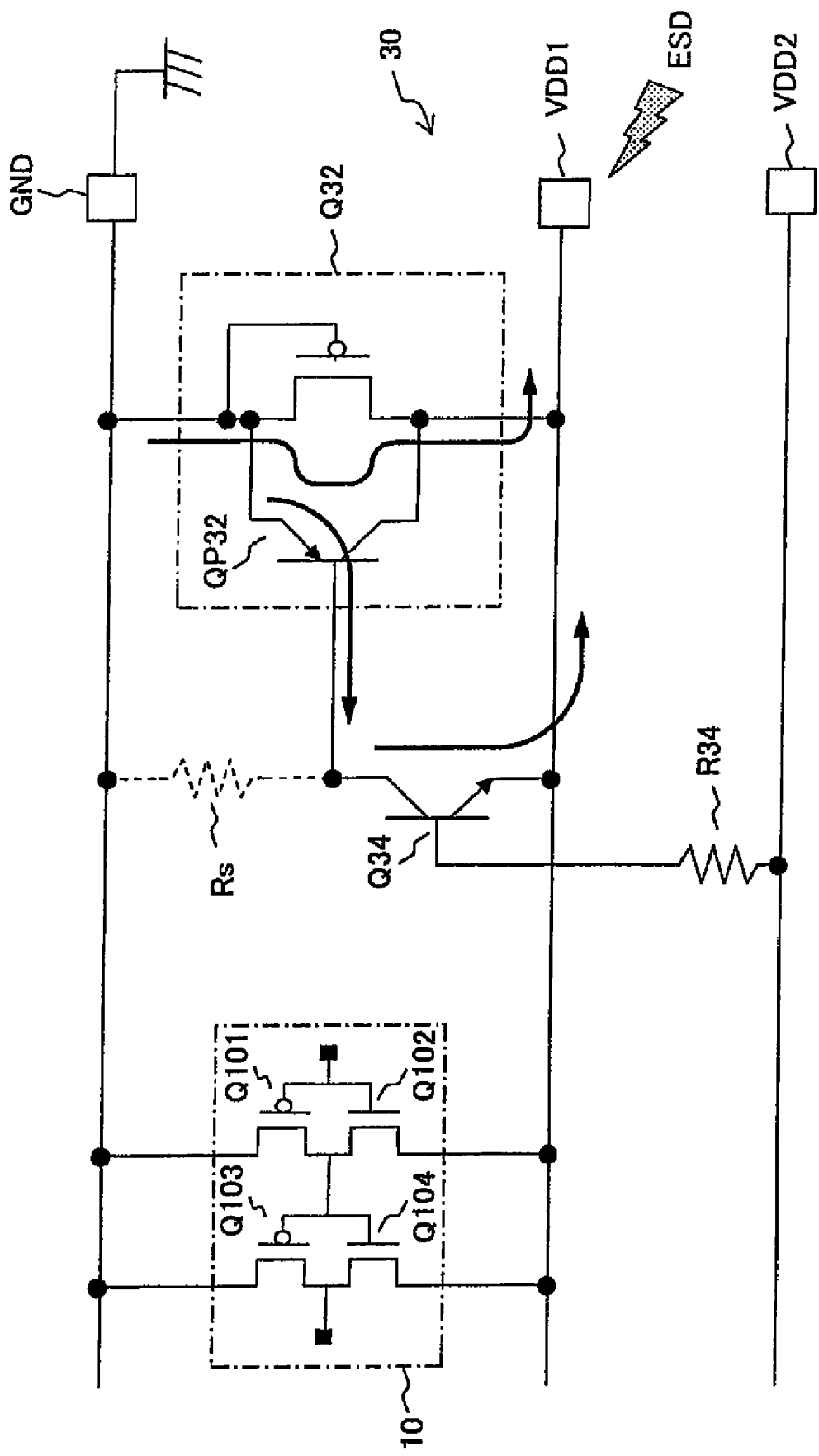
FIG. 8 is a drawing showing another structure of an ESD protection circuit formed on a conductive substrate.

FIG. 8 is a drawing showing the structure of an ESD protection circuit which is formed at substrate of another conductive type. This integrated circuit is formed on an N-type substrate, and the power source potentials VDD1 and VDD2 are lower potentials (negative power sources) than the ground potential.

An ESD protection circuit 30 shown in FIG. 8 has a PMOS transistor Q32 serving as a protecting transistor, and an NPN-type bipolar transistor Q34. In terms of structure, a PNP-type parasitic bipolar transistor QP32 is formed under the PMOS transistor Q32 as shown in FIG. 8. In this ESD protection circuit 30, the NPN-type bipolar transistor Q34 behaves as a trigger element for making the PMOS transistor Q32 is changed into bipolar operation at an early stage after an ESD event occurs.

The operation of the ESD protection circuit 30 shown in FIG. 8 is exactly the same as the case of the P-type substrate described above. Namely, in the ESD protection circuit 30 shown in FIG. 8, for example, when a negative ESD event occurs at the VDD1 terminal, the bipolar transistor Q34 and the parasitic bipolar transistor QP32 turn on in that order, and dissipate the surge current from the ground line to the power source line (VDD1).

Second Exemplary Embodiment

A second exemplary embodiment of the semiconductor integrated circuit of the present invention will be described hereinafter.

The integrated circuit of the present exemplary embodiment is a circuit at which an even better ESD protecting performance is obtained as compared with the integrated circuit of the first exemplary embodiment. Hereinafter, the structure and operation of an integrated circuit 2 of the present exemplary embodiment will be described in that order with reference to FIGS. 9 through 11.

[Structure of Integrated Circuit 2]

Figure 9:
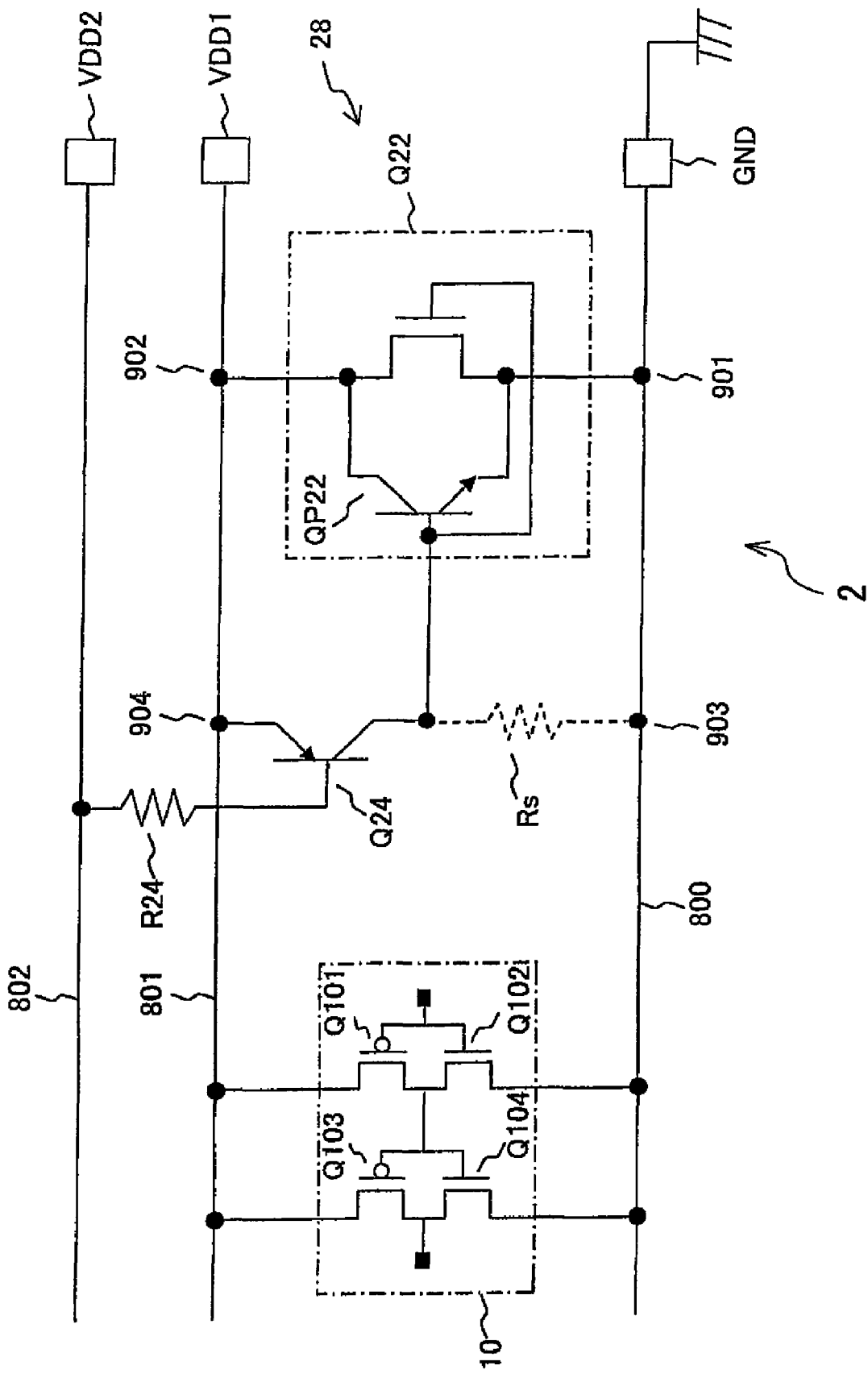
FIG. 9 is a schematic circuit diagram of an integrated circuit of a second exemplary embodiment.

FIG. 9 is a schematic circuit diagram of the integrated circuit 2 which includes an ESD protection circuit.

In FIG. 9, regions which are the same as those of the integrated circuit 1 shown in FIG. 3 are denoted by the same reference numerals, and description thereof is omitted. As compared with the ESD protection circuit 20 of the previously-described integrated circuit 1, an ESD protection circuit 28 of the integrated circuit 2 of the present exemplary embodiment differs only with respect to the connection of the NMOS transistor Q22. Namely, as shown in FIG. 9, in the ESD protection circuit 28, only the point that the gate of NMOS transistor Q22 is connected to the substrate differs from the ESD protection circuit 20.

[Operation of Integrated Circuit 2]

The ESD protecting operation of the integrated circuit 2 of the present exemplary embodiment will be described next with reference to FIG. 10 and FIG. 11.

Figure 10:
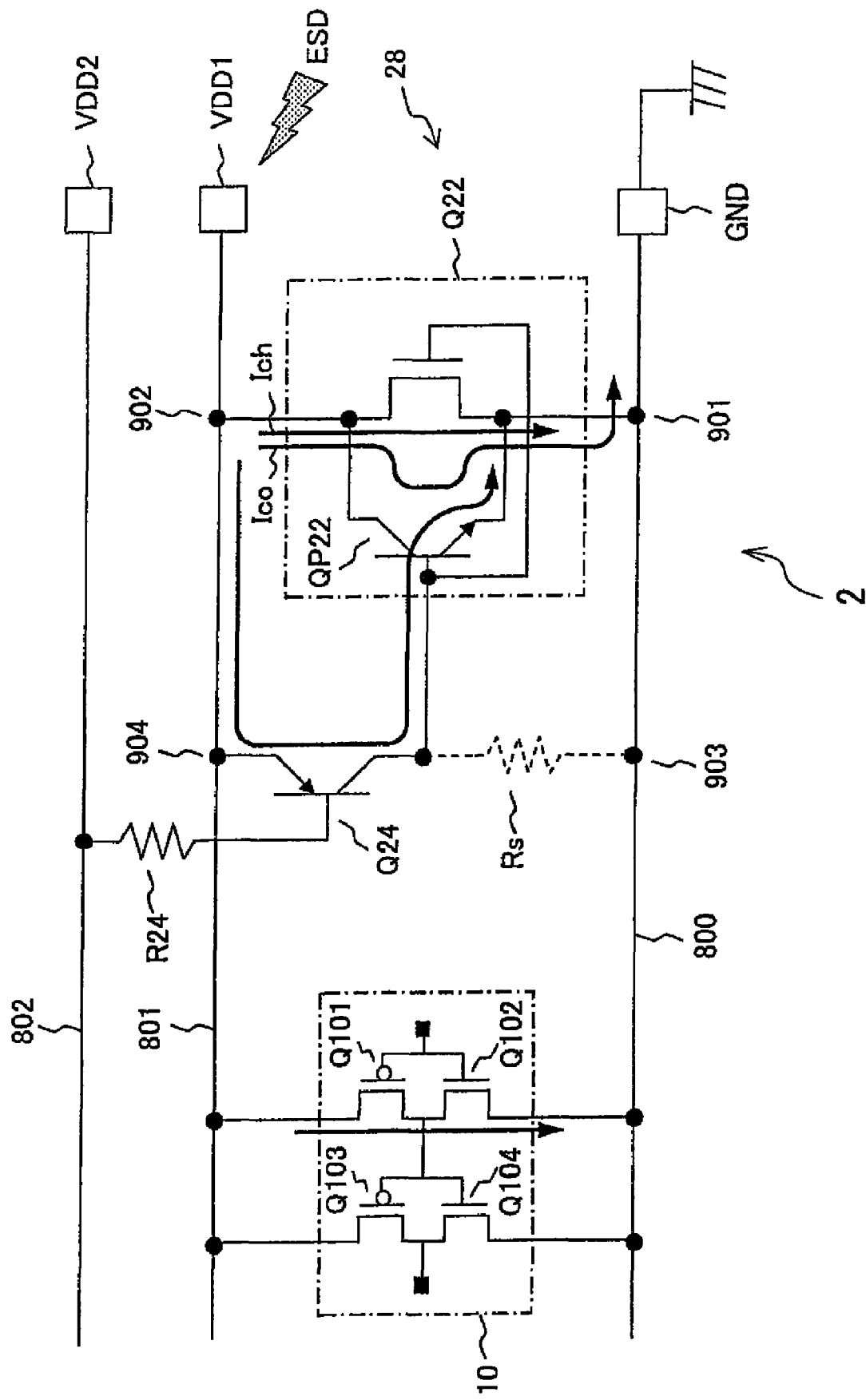
FIG. 10 is a drawing showing the flow of surge current at the time an ESD event occurs in the integrated circuit of the second exemplary embodiment.

FIG. 10 is a drawing showing the flow of surge current in a case in which an ESD event occurs at the VDD1 terminal. FIG. 11 is an imaginable graph showing that indicates the relationship (the V-I characteristic) between the voltage of the line 801 and the current flowing from the drain of the NMOS transistor Q22 to the GND terminal when an ESD event occurs at the VDD1 terminal. As shown in FIG. 11, (a) shows a case in which the gate length of the NMOS transistor Q22 is the minimum value, i.e., a case in which the gate length is the minimum value allowed in the fabricating process in the same way as the MOS transistors in the function circuit 10, and (b) shows a case in which the gate length of the NMOS transistor Q22 is longer than the minimum value. Note that, for reference, (c) in FIG. 11 shows the V-I characteristic of the NMOS transistor Q22 in the case of the first exemplary embodiment (a case in which the gate length is the minimum value, which is the same as (a) in FIG. 5), and (d) in FIG. 11 shows the V-I characteristic of the NMOS transistor Q22 in the case of the first exemplary embodiment (a case in which the gate length is longer than the minimum value, which is the same as (b) in FIG. 5), and (e) in FIG. 11 shows the V-I characteristic of the function circuit 10 (the same as (c) in FIG. 5).

In the integrated circuit 2 of the present exemplary embodiment, the point that the NMOS transistor Q22 is made to be changed at an early stage to bipolar operation at a low voltage due to the bipolar transistor Q24 supplying current to the substrate of the NMOS transistor Q22 when an ESD event occurs, is the same as the integrated circuit 1 of the first exemplary embodiment. In this way, the surge current is dissipated to the ground as the collector current Ico (see FIG. 10) before the applied voltage in the ESD event reaches the breakdown voltage of the NMOS transistors within the function circuit 10.

Further, in the integrated circuit 2 of the present exemplary embodiment, when, after the bipolar transistor Q24 turns on, the substrate potential of the NMOS transistor Q22 rises and the voltage between the gate and source of the NMOS transistor Q22 exceeds an operation threshold value, as shown in FIG. 10, channel current Ich serving as surge current flows from the node 902 toward the node 901.

This channel current Ich flows through a region in the vicinity of the substrate surface of the integrated circuit 2, whereas the collector current Ico flows through a region which is deeper from the substrate surface (a region at the lower side). Namely, the channel current Ich and the collector current Ico exist independently of one another. Accordingly, in the integrated circuit 2 of the present exemplary embodiment, as compared with the integrated circuit 1 of the first exemplary embodiment, the current driving ability at the time when the surge current is dissipated to the ground is increased by an amount corresponding to the channel current Ich.

Figure 11:
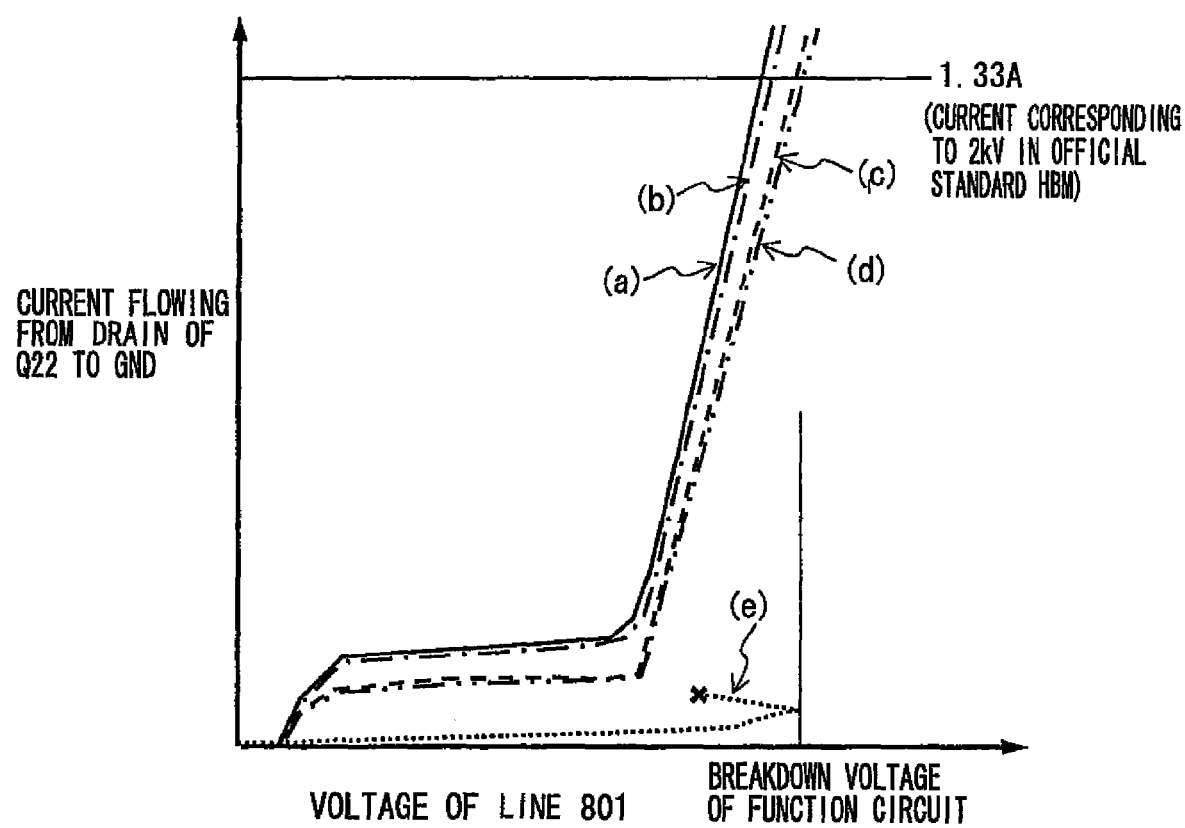
FIG. 11 is an imaginable graph showing V-I characteristics at the time an ESD event occurs in the integrated circuit of the second exemplary embodiment.

The point that the current driving ability increases can be understood well by referring to FIG. 11. In order to compare the first exemplary embodiment and the second exemplary embodiment, comparison is carried out of cases in which the gate lengths are the same, e.g., (a) and (c) of the V-I characteristics of FIG. 11 are compared. The current which flows from the drain of the NMOS transistor Q22 to the GND terminal is only the collector current Ico in the case of (c) in FIG. 11 (the first exemplary embodiment), whereas it is the total sum of the collector current Ico and the channel current Ich in the case of (a) in FIG. 11 (the present exemplary embodiment). Accordingly, as illustrated in FIG. 11, the whole of the V-I characteristic shown by (a) is shifted upward from the characteristic shown by (c). Note that the same can be said in the other comparison of cases in which the gate lengths are the same, i.e., when comparing (b) and (d) of the V-I characteristics of FIG. 11.

As described above, in accordance with the integrated circuit 2 of the present exemplary embodiment, as compared with the integrated circuit 1 of the first exemplary embodiment, the current driving ability (Ico+Ich) at the NMOS transistor Q22 at the time of an ESD event increases, and therefore, the ESD protecting performance can be further improved.

Note that, at the time of normal operation of the integrated circuit 2, because the gate of the NMOS transistor Q22 is grounded via the substrate resistor Rs, the NMOS transistor Q22 is maintained in an off state and does not affect the function circuit 10.

Further, as compared with the integrated circuit 1 of the first exemplary embodiment, the integrated circuit 2 of the present exemplary embodiment is only changed such that the gate of the NMOS transistor Q22 is connected to the substrate. The modified examples described in the first exemplary embodiment can of course be similarly applied to the integrated circuit 2 of the present exemplary embodiment as well. For example, it is preferable that the gate length of the NMOS transistor Q22 be selected to a value which is longer than the gate length of the MOS transistors within the function circuit 10. In this way, both high integration of the function circuit 10 and a reduction in the off leak current of the integrated circuit 1 overall can be achieved, while the ESD protecting performance is maintained.

Third Exemplary Embodiment

A third exemplary embodiment of the semiconductor integrated circuit of the present invention will be described hereinafter.

In the integrated circuit 1 of the above-described first exemplary embodiment, the power source voltage VDD2 which satisfies above formula (1) is needed within the integrated circuit 1 in order to set the bipolar transistor Q24 in an off state at the time of normal operation. However, in actuality, cases in which the power source voltage VDD2 which satisfies above formula (1) does not exist (e.g., a case in which VDD2=1.2 V, VDD1=3.3V) can also be thought of Accordingly, there is desired an integrated circuit for setting the bipolar transistor Q24 in an off state at the time of normal operation, even in cases in which the power source voltage VDD2 which satisfies formula (1) does not exist. Such an integrated circuit will be described in the present exemplary embodiment.

[Structure of Integrated Circuit 3]

Figure 12:
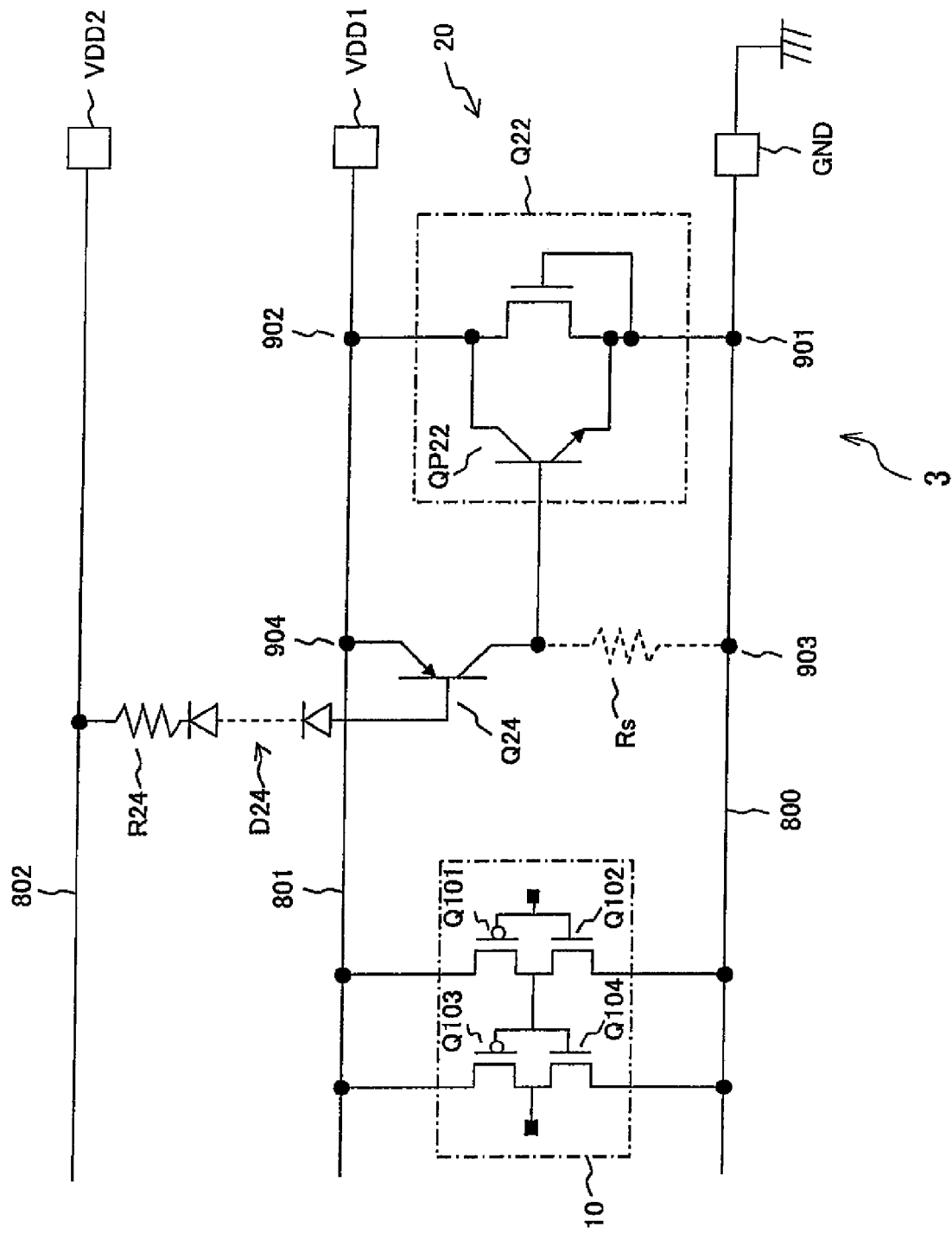
FIG. 12 is a schematic circuit diagram of an integrated circuit of a third exemplary embodiment.

FIG. 12 is a schematic circuit diagram of an integrated circuit 3 which includes an ESD protection circuit. In FIG. 12, regions which are the same as those of the integrated circuit 1 shown in FIG. 3 are denoted by the same reference numerals, and description thereof is omitted. As compared with the above-described integrated circuit 1, the integrated circuit 3 of the present exemplary embodiment differs only with regard to the point that a diode group D24 (one or plural PN junction elements) is provided between the base of the bipolar transistor Q24 and the resistor R24.

In the integrated circuit 3, given that the number of diodes included in the diode group D24 is N, N is selected so as to satisfy following formula (2).

$$VDD2+(N+1)\times Vf>VDD1 \tag{2}$$

In formula (2), Vf is the forward direction voltage of the PN junction (about 0.6 V in the case of a silicon semiconductor). In above formula (2), the "1" which in the coefficient "(N+1)" means the bipolar transistor Q24 itself, because the bipolar transistor Q24 has one pn junction.

For example, if the power source potentials which are intrinsically furnished at the integrated circuit 3 are VDD2=1.2 V and VDD1=3.3 V, formula (1) is not satisfied. However, by providing the diode group D24 which includes three PN junction diodes (N=3), above formula (2) can be satisfied.

In the present exemplary embodiment, by providing the diode group D24 which is such that above formula (2) is satisfied, even in cases in which only a low voltage which does not satisfy formula (1) is obtained as the power source potential VDD2, reverse bias can be applied between the base and the emitter of the PNP-type bipolar transistor Q24, and the bipolar transistor Q24 can be maintained in an off state at the time of normal operation. Note that the operation of the integrated circuit 3 is the same as that of the integrated circuit 1 of the first exemplary embodiment.

Figure 13:
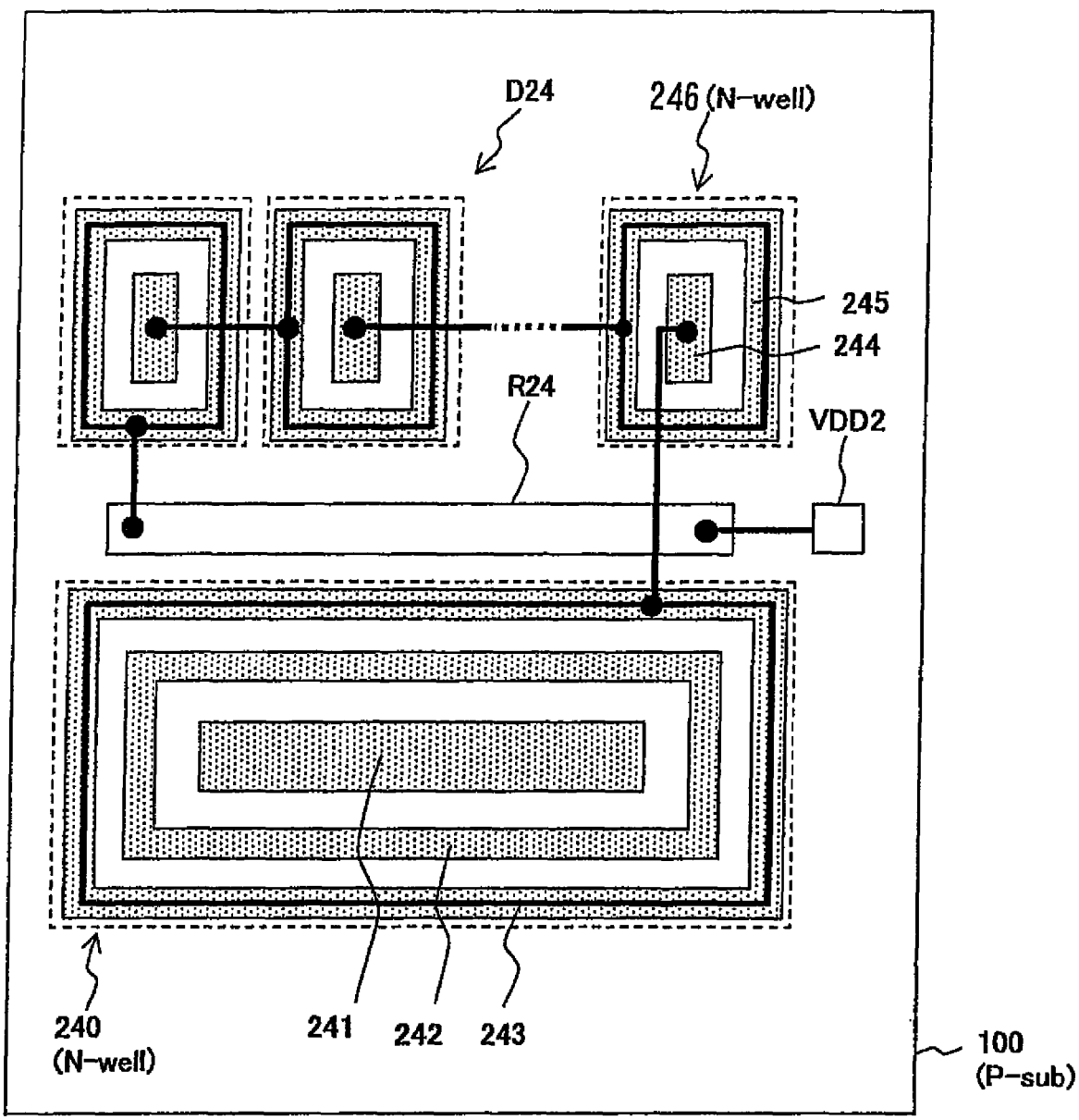
FIG. 13 is a plan view of the integrated circuit of the third exemplary embodiment, and shows a preferred arrangement of a bipolar transistor and a diode group within an ESD protection circuit.

FIG. 13 is a plan view of the integrated circuit 3, and shows a preferred arrangement of the PNP-type bipolar transistor Q24 and the diode group D24. Note that the function circuit 10 and the NMOS transistor Q22 are omitted from FIG. 13.

In FIG. 13, the arrangement of the bipolar transistor Q24 is the same as in the first exemplary embodiment (FIG. 7). Namely, from the standpoint of the current driving ability of the parasitic bipolar transistor QP22, it is preferable that the base region of the bipolar transistor Q24 (an N-type impurity diffusion region) be disposed at either of the first region 241 or the third region 243. Further, from the standpoint of design of inter connect layers, it is more preferable that the base region be formed at the third region 243 which is at the outermost side.

In FIG. 13, the respective diodes structuring the diode group D24 are formed at the N-type well regions (N-well) 246 within the P-type substrate 100. A fourth region 244 is formed at the central portion of the N-type well region 246. A ring-shaped fifth region 245 is formed at the periphery of the fourth region 244. An anode (P-type impurity diffusion region) is formed at the fourth region 244, and a cathode (N-type impurity diffusion region) is formed at the fifth region 245.

As described above, in accordance with the integrated circuit 3 of the present exemplary embodiment, because the diode group D24 is provided between the base of the bipolar transistor Q24 and the resistor R24, even in cases in which the power source voltage VDD2 which satisfies formula (1) does not exist, the bipolar transistor Q24 can be set in an off state at times of normal operation. Note that a switching element, which is in an off state at the time of normal operation, may be provided instead of the diode group D24. For example, a MOS transistor, to which is applied gate voltage which causes the MOS transistor in an off state at times of normal operation, can be used as the switching element.

What is claimed is:

1. A semiconductor integrated circuit comprising:
   a reference potential line to which a reference potential is provided;
   a first potential line to which a first power source potential is provided;
   a second potential line to which a second power source potential is provided;
   a function circuit connected between the reference potential line and to the first potential line, and executing a predetermined function by a transistor;
   a protecting transistor connected in parallel to the function circuit, between the reference potential line and the first potential line; and
   a bipolar transistor having a base connected to the second potential line, an emitter connected to the first potential line, and a collector connected to a substrate of the protecting transistor,
   wherein the base of the bipolar transistor has a conductivity type that is the same as source and drain regions of the protecting transistor, and
   wherein the second power source potential is set such that $$VDD2+Vf>VDD1,$$

wherein VDD1 is the first power source potential, VDD2 is the second power source potential, and Vf is a forward direction voltage of a PN junction of the bipolar transistor.

2. The semiconductor integrated circuit of claim 1, wherein the collector of the bipolar transistor is connected to the substrate and a gate of the protecting transistor.

3. The semiconductor integrated circuit of claim 1, wherein a gate length of the protecting transistor is longer than a gate length of the transistor within the function circuit.

4. The semiconductor integrated circuit of claim 2, wherein a gate length of the protecting transistor is longer than a gate length of the transistor within the function circuit.

5. The semiconductor integrated circuit of claim 1, wherein a region at which the bipolar transistor is comprises:
   a first region;
   a ring-shaped second region at a periphery of the first region; and
   a ring-shaped third region at a periphery of the second region,
   wherein the base of the bipolar transistor is at either of the first region or the third region.

6. The semiconductor integrated circuit of claim 5, wherein the base of the bipolar transistor is at the third region.

* * * * *